United States Patent
Cheng et al.

(10) Patent No.: US 12,414,317 B2
(45) Date of Patent: Sep. 9, 2025

(54) RESONANT TUNNELING DIODES AND MANUFACTURING METHODS THEREOF

(71) Applicant: ENKRIS SEMICONDUCTOR, INC., Jiangsu (CN)

(72) Inventors: Kai Cheng, Jiangsu (CN); Kai Liu, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 485 days.

(21) Appl. No.: 17/783,292

(22) PCT Filed: Mar. 5, 2021

(86) PCT No.: PCT/CN2021/079266
§ 371 (c)(1),
(2) Date: Jun. 8, 2022

(87) PCT Pub. No.: WO2022/183475
PCT Pub. Date: Sep. 9, 2022

(65) Prior Publication Data
US 2023/0343877 A1  Oct. 26, 2023

(51) Int. Cl.
*H10D 8/75* (2025.01)
*H10D 8/01* (2025.01)
(Continued)

(52) U.S. Cl.
CPC ............. *H10D 8/755* (2025.01); *H10D 8/053* (2025.01); *H10D 62/8503* (2025.01); *H10H 20/8162* (2025.01)

(58) Field of Classification Search
CPC . H01L 29/2003; H01L 29/882; H10D 62/852; H10D 8/755
See application file for complete search history.

(56) References Cited

U.S. PATENT DOCUMENTS 10,916,680 B2    2/2021  Zhang et al.
2010/0248459 A1* 9/2010  Makabe ............ H01L 21/02381
                                                438/681
(Continued)

FOREIGN PATENT DOCUMENTS

CN    105845716 A  *  8/2016  ........... H01L 29/151
CN    105895670 A  *  8/2016
(Continued)

OTHER PUBLICATIONS

ISA State Intellectual Property Office of the People's Republic of China, International Search Report Issued in Application No. PCT/CN2021/079266, Dec. 8, 2021, WIPO, 4 pages.
(Continued)

*Primary Examiner* — Evren Seven
(74) *Attorney, Agent, or Firm* — The Small Patent Law Group LLC; Christopher R. Carroll

(57) ABSTRACT

The present disclosure provides a resonant tunneling diode including: a first barrier layer; a second barrier layer; a potential well layer between the first barrier layer and the second barrier layer, materials of the first barrier layer, the second barrier layer, and the potential well layer including a group III nitride, a material of the potential well layer including a gallium element; a first barrier layer between the first barrier layer and the potential well layer; and/or a second barrier layer between the second barrier layer and the potential well layer.

10 Claims, 3 Drawing Sheets

(51) Int. Cl.
*H10D 62/85* (2025.01)
*H10H 20/816* (2025.01)

(56) References Cited

U.S. PATENT DOCUMENTS

| | | | |
|---|---|---|---|
| 2010/0270591 A1* | 10/2010 | Ahn | H10D 30/473 |
| | | | 257/E21.403 |
| 2016/0218201 A1* | 7/2016 | Okamoto | H01L 21/02609 |
| 2019/0006474 A1* | 1/2019 | Lin | H01L 21/02172 |
| 2019/0027644 A1* | 1/2019 | Brown | H01L 33/007 |
| 2020/0105881 A1* | 4/2020 | Ramaswamy | H01L 29/882 |
| 2020/0287077 A1 | 9/2020 | Zhang et al. | |

FOREIGN PATENT DOCUMENTS

| | | | | |
|---|---|---|---|---|
| CN | 106876442 A | * | 6/2017 | |
| CN | 107706245 A | * | 2/2018 | H01L 29/2003 |
| CN | 108183136 A | | 6/2018 | |
| CN | 109524305 A | * | 3/2019 | H01L 21/28 |
| CN | 109545861 A | * | 3/2019 | H01L 29/0684 |
| CN | 110085682 A | * | 8/2019 | H01L 29/66151 |
| CN | 111668351 A | | 9/2020 | |
| CN | 111785786 A | * | 10/2020 | |
| EP | 0697741 A1 | | 2/1996 | |

OTHER PUBLICATIONS

ISA State Intellectual Property Office of the People's Republic of China, Written Opinion of the International Searching Authority Issued in Application No. PCT/CN2021/079266, Dec. 8, 2021, WIPO, 4 pages.(Submitted with Machine/Partial Translation).

* cited by examiner

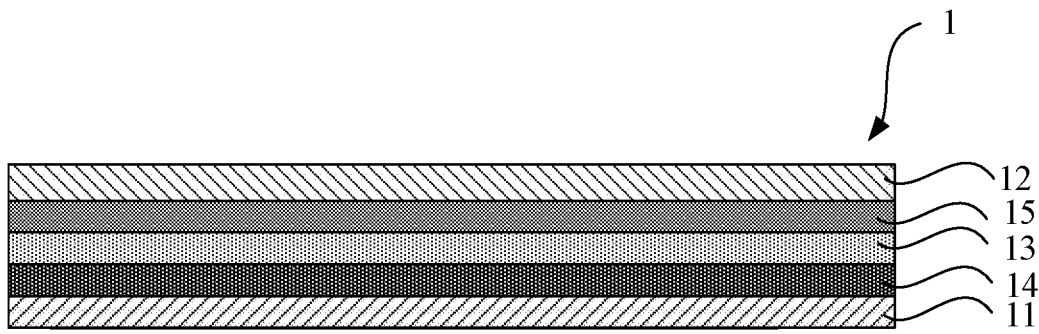
FIG. 1
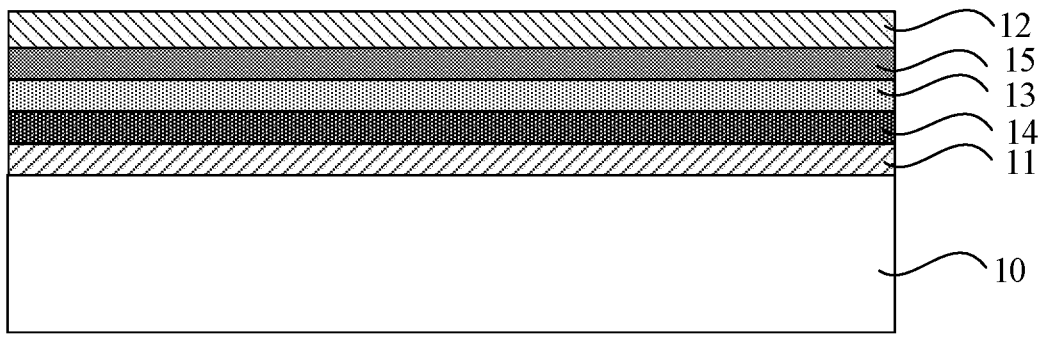
FIG. 2
FIG. 3

RESONANT TUNNELING DIODES AND MANUFACTURING METHODS THEREOF

CROSS REFERENCE TO RELATED APPLICATION

This application is a US National Phase of a PCT Application No. PCT/CN2021/079266, filed on Mar. 5, 2021, the contents of which are incorporated herein by reference in its entirety.

TECHNICAL FIELD

The present disclosure relates to the field of semiconductor technology, and more particularly to resonant tunneling diodes and manufacturing methods thereof.

BACKGROUND

Terahertz technology, as a new science and technology, has important application prospects in security detection, material identification, secure communication, space exploration, high-precision radar, tissue biopsy, transient spectrum research and so on. A resonant tunneling diode, as a dual-terminal device, can produce negative differential resistance by using resonant tunneling phenomenon, which is configured to prepare terahertz radiation source, resulting in a wide range of concerns.

At present, a mature resonant tunneling diode (RTD) is mainly a GaAs-based material, due to inherent performance limitations of GaAs-based materials, a power of RTD merely reaches an order of micro watts. GaN-based resonant tunneling diodes have advantages of group III nitride semiconductor materials, such as, high electron rate, high breakdown field strength, large band gap adjustable range and radiation resistance. With this configuration, it is expected to realize terahertz high-power emission at room temperature.

However, at present, nitride-based resonant tunneling diodes face problems of poor device stability and low peak-to-valley current ratio, which greatly limits its practical application.

SUMMARY

An object of the present disclosure is to provide a resonant tunneling diode and a manufacturing method thereof, so as to improve a device stability and a peak-to-valley current ratio.

To achieve the above object, a first aspect of the present disclosure provides a resonant tunneling diode, including:
a first barrier layer; a second barrier layer; a potential well layer between the first barrier layer and the second barrier layer, where a material of the first barrier layer, a material of the second barrier layer, and a material of the potential well layer all include a group III nitride, the material of the potential well layer includes a gallium element; a first isolation layer between the first barrier layer and the potential well layer; and/or a second isolation layer between the second barrier layer and the potential well layer.

In some embodiments, the material of the first barrier layer and the material of the second barrier layer include at least one of AlGaN, AlInGaN, or InAlN.

In some embodiments, a material of the first isolation layer and/or a material of the second isolation layer includes AlN.

In some embodiments, a thickness of the first isolation layer ranges from 0.1 nm to 2 nm; and/or a thickness of the second isolation layer ranges from 0.1 nm to 2 nm.

In some embodiments, the resonant tunneling diode further includes a collector electrode and an emitter electrode, the collector electrode being close to the first barrier layer, the emitter electrode being close to the second barrier layer; a third isolation layer between the collector electrode and the first barrier layer; and/or a fourth isolation layer between the emitter electrode and the second barrier layer.

In some embodiments, a material of the collector electrode and a material of the emitter electrode include a GaN-based material.

In some embodiments, a material of the third isolation layer and/or a material of the fourth isolation layer includes AlN.

A second aspect of the present disclosure provides a method of manufacturing a resonant tunneling diode, including:
epitaxially growing a first barrier layer, a potential well layer, and a second barrier layer in sequence on a substrate, where a material of the first barrier layer, a material of the second barrier layer, and a material of the potential well layer include a group III nitride, the material of the potential well layer includes a gallium element; removing the substrate;
before epitaxially growing the potential well layer, epitaxially growing a first isolation layer on the first barrier layer; and/or before epitaxially growing the second barrier layer, epitaxially growing a second isolation layer on the potential well layer.

In some embodiments, the material of the first barrier layer and the material of the second barrier layer include at least one of AlGaN, AlInGaN, or InAlN.

In some embodiments, a material of the first isolation layer and/or a material of the second isolation layer includes AlN.

In some embodiments, a thickness of the first isolation layer ranges from 0.1 nm to 2 nm; and/or a thickness of the second isolation layer ranges from 0.1 nm to 2 nm.

In some embodiments, the method of manufacturing the resonant tunneling diode further includes: epitaxially growing a collector electrode on a side of the first barrier layer away from the potential well layer; epitaxially growing an emitter electrode on a side of the second barrier layer away from the potential well layer, where a material of the collector electrode and a material of the emitter electrode both include a group III nitride;
or before epitaxially growing the first barrier layer, epitaxially growing the collector electrode on the substrate, epitaxially growing the emitter electrode on the second barrier layer, where the material of the collector electrode and the material of the emitter electrode both include a group III nitride.

In some embodiments, the method of manufacturing the resonant tunneling diode further includes: before epitaxially growing the collector electrode on the side of the first barrier layer away from the potential well layer, epitaxially growing a third isolation layer on the side of the first barrier layer away from the potential well layer; or after epitaxially growing the collector electrode on the substrate, and before epitaxially growing the first barrier layer, epitaxially growing the third isolation layer;
and/or, before epitaxially growing the emitter electrode on the side of the second barrier layer away from the potential well layer, epitaxially growing a fourth isolation layer on the side of the second barrier layer away from the potential well layer.

In some embodiments, the material of the collector electrode and the material of the emitter electrode include a GaN-based material.

In some embodiments, a material of the third isolation layer and/or a material of the fourth isolation layer includes AlN.

Compared with the related art, the present disclosure has the following beneficial effects:

using the first isolation layer and the second isolation layer can prevent gallium atoms in the potential well layer from diffusing to the first barrier layer and the second barrier layer, ensuring that compositions of the first barrier layer and the second barrier layer are uniform, preventing an effective thickness from thinning, thereby improving a device stability and a peak-to-valley current ratio.

BRIEF DESCRIPTION OF THE DRAWINGS

FIG. 1 is a cross-sectional schematic view of a resonant tunneling diode according to a first embodiment of the present disclosure;

FIG. 2 is a flowchart of a method of manufacturing a resonant tunneling diode in FIG. 1;

FIG. 3 is a schematic view illustrating an intermediate structure corresponding to processes in FIG. 2;

Figure 4:
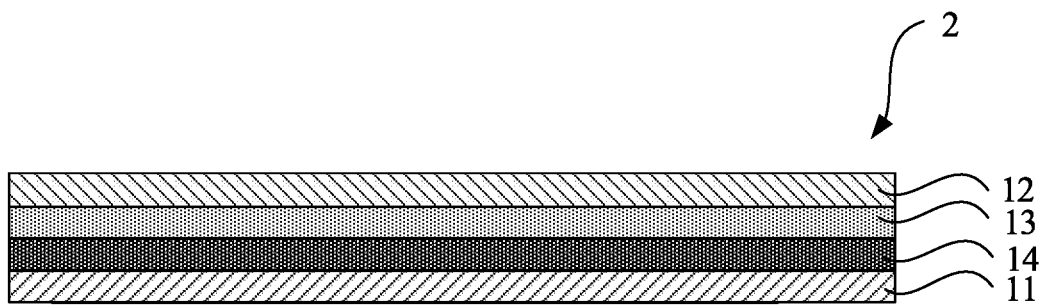
FIG. 4 is a cross-sectional schematic view of a resonant tunneling diode according to a second embodiment of the present disclosure.

To facilitate understanding of the present disclosure, all reference numerals appearing in the present disclosure are listed below:

| | |
|---|---|
| resonant tunneling diodes 1, 2, 3, 4, 5 | substrate 10; |
| first barrier layer 11 | second barrier layer 12 |
| potential well layer 13 | first isolation layer 14 |
| second isolation layer 15 | third isolation layer 16 |
| fourth isolation layer 17 | collector electrode 20 |
| emitter electrode 30 | |

DETAILED DESCRIPTION OF THE EMBODIMENTS

To make the above-mentioned objects, features and advantages of the present disclosure more obvious and understandable, embodiments of the present disclosure will be described in detail below with reference to the accompanying drawings.

FIG. 1 is a cross-sectional schematic view of a resonant tunneling diode according to a first embodiment of the present disclosure.

Referring to FIG. 1, the resonant tunneling diode 1 includes:

a first barrier layer 11; a second barrier layer 12; a potential well layer 13 between the first barrier layer 11 and the second barrier layer 12, where a material of the first barrier layer 11, a material of the second barrier layer 12, and a material of the potential well layer 13 all include a group III nitride, and the material of the potential well layer 13 includes a gallium (Ga) element; a first isolation layer 14 between the first barrier layer 11 and the potential well layer 13; and a second isolation layer 15 between the second barrier layer 12 and the potential well layer 13.

The first barrier layer 11, the potential well layer 13, and the second barrier layer 12 form a dual barrier quantum well structure. A band gap width of the potential well layer 13 is less than a band gap width of the first barrier layer 11 and a band gap width of the second barrier layer 12. The material of the potential well layer 13 includes GaN. The material of the first barrier layer 11 and the material of the second barrier layer 12 include at least one of AlGaN, AlInGaN, or InAlN. In some embodiments, the first barrier layer 11 and/or the second barrier layer 12 are/is a single layer structure, a material of the single layer structure includes a mixture of one or more of AlGaN, AlInGaN, or InAlN. In other embodiments, the first barrier layer 11 and/or the second barrier layer 12 are/is a stacked structure, the stacked structure includes two or three layers. When the stacked structure includes two layers, the stacked structure can include, from bottom to top, an AlGaN layer and an AlInGaN layer, an AlInGaN layer and an AlGaN layer, an InAlN layer and an AlGaN layer, an InAlN layer and an AlInGaN layer, an AlGaN layer and an InAlN layer, or an AlInGaN layer and an InAlN layer. When the stacked structure includes three layers, respective layers in the stacked structure can be any one of an AlGaN layer, an AlInGaN layer, or an InAlN layer, materials of adjacent two layers in the stacked structure are different.

A GaN material is lattice-matched to an AlGaN material, an AlInGaN material, or an InAlN material. However, a band gap width of the AlGaN material varies as an aluminum composition varies; if gallium atoms in the GaN material diffuse into the AlGaN material, which can cause a resonant tunneling effect of the resonant tunneling diode 1 to be unstable, thereby resulting in a low peak-to-valley current ratio of the resonant tunneling diode 1. For the AlInGaN material and the InAlN material, in addition to band gap widths vary as aluminum composition varies, due to an indium atom having a larger atomic radius than other atoms and indium atomic components being different, activities vary greatly; and if gallium atoms in the GaN material diffuse into the AlInGaN material and the InAlN material, which can cause the resonant tunneling effect of the resonant tunneling diode 1 to be unstable.

In this embodiment, it is noted that a chemical element represents a certain material, but molar ratios of respective chemical elements in a material are not limited. For example, a GaN material includes a gallium element and a nitrogen element, but a molar ratio of the gallium element to the nitrogen element is not limited; an AlGaN material includes aluminum, gallium and nitrogen elements, but respective molar ratios of the three elements are not limited.

The arrangements of the first isolation layer 14 and the second isolation layer 15 can prevent gallium atoms in the potential well layer 13 from diffusing to the first barrier layer 11 and the second barrier layer 12, ensuring that compositions of the first barrier layer 11 and the second barrier layer 12 are uniform, preventing an effective thickness from thinning, thereby improving a device stability and a peak-to-valley current ratio of the resonant tunneling diode 1. A material of the first isolation layer 14 and a material of the second isolation layer 15 can include AlN.

A thickness of the first isolation layer 14 can range from 0.1 nm to 2 nm. A thickness of the second isolation layer 15 can range from 0.1 nm to 2 nm.

The present embodiments further provide a method of manufacturing the resonant tunneling diode of FIG. 1. FIG. 2 is a flowchart of a manufacturing method; FIG. 3 is a schematic view illustrating an intermediate structure corresponding to processes in FIG. 2.

First, referring to step S1 in FIG. 2 and FIG. 3, a first barrier layer 11, a first isolation layer 14, and a potential well layer 13 are epitaxially grown in sequence on a substrate 10, a material of the first barrier layer 11 and a material of the potential well layer 13 both include a group III nitride, and the material of the potential well layer 13 include a gallium element.

A material of the substrate 10 can include at least one of sapphire, silicon carbide, or silicon; or at least one of sapphire, silicon carbide, or silicon, and the group III nitride material; which is not limited in this embodiment.

The material of the first barrier layer 11 can include at least one of AlGaN, AlInGaN, or InAlN. In some embodiments, the first barrier layer 11 is a single layer structure, a material of the single layer structure includes a mixture of one or more of AlGaN, AlInGaN, or InAlN. In other embodiments, the first barrier layer 11 is a stacked structure, the stacked structure can include two or three layers. When the stacked structure includes two layers, the stacked structure can include, from bottom to top, an AlGaN layer and an AlInGaN layer, an AlInGaN layer and an AlGaN layer, an InAlN layer and an AlGaN layer, an InAlN layer and an AlInGaN layer, an AlGaN layer and an InAlN layer, or an AlInGaN layer and an InAlN layer. When the stacked structure includes three layers, respective layers in the stacked structure can be any one of an AlGaN layer, an AlInGaN layer, or an InAlN layer, materials of adjacent two layers in the stacked structure are different.

A band gap width of the potential well layer 13 is less than a band gap width of the first barrier layer 11. The material of the potential well layer 13 includes GaN.

The arrangement of the first isolation layer 14 can prevent gallium atoms in the potential well layer 13 from diffusing to the first barrier layer 11, ensuring that compositions of the first barrier layer 11 are uniform, preventing an effective thickness from thinning, thereby improving a device stability and a peak-to-valley current ratio of the resonant tunneling diode 1. A material of the first isolation layer 14 can include AlN.

A thickness of the first isolation layer 14 can range from 0.1 nm to 2 nm.

The epitaxial growth processes of the first barrier layer 11, the first isolation layer 14 and the potential well layer 13 can include: atomic layer deposition (ALD), chemical vapor deposition (CVD), molecular beam epitaxy (MBE), plasma enhanced chemical vapor deposition (PECVD), low pressure chemical vapor deposition (LPCVD), or metal-organic chemical vapor deposition (MOCVD), or a combination thereof.

Next, referring to step S2 in FIG. 2 and FIG. 3, a second isolation layer 15 and a second barrier layer 12 are epitaxially grown in sequence on the potential well layer 13, a material of the second barrier layer 12 includes a group III nitride.

A band gap width of the second barrier layer 12 is greater than a band gap width of the potential well layer 13.

The material of the second barrier layer 12 can include at least one of AlGaN, AlInGaN, or InAlN. In some embodiments, the second barrier layer 12 is a single layer structure, a material of the single layer structure includes a mixture of one or more of AlGaN, AlInGaN, or InAlN. In other embodiments, the second barrier layer 12 is a stacked structure, the stacked structure can include two or three layers. When the stacked structure includes two layers, the stacked structure can include, from bottom to top, an AlGaN layer and an AlInGaN layer, an AlInGaN layer and an AlGaN layer, an InAlN layer and an AlGaN layer, an InAlN layer and an AlInGaN layer, an AlGaN layer and an InAlN layer, or an AlInGaN layer and an InAlN layer. When the stacked structure includes three layers, respective layers in the stacked structure can be any one of an AlGaN layer, an AlInGaN layer, or an InAlN layer, materials of adjacent two layers in the stacked structure are different.

The arrangement of the second isolation layer 15 can prevent gallium atoms in the potential well layer 13 from diffusing to the second barrier layer 12, ensuring that compositions of the second barrier layer 12 are uniform, preventing an effective thickness from thinning, thereby improving a device stability and a peak-to-valley current ratio of the resonant tunneling diode 1. A material of the second isolation layer 15 can include AlN.

A thickness of the second isolation layer 15 can range from 0.1 nm to 2 nm.

Epitaxial growth processes of the second isolation layer 15 and the second barrier layer 12 can refer to the epitaxial growth processes of the first barrier layer 11, the first isolation layer 14, and the potential well layer 13.

Thereafter, referring to step S3 in FIG. 2, FIG. 3 and FIG. 1, the substrate 10 is removed.

The substrate 10 can be removed by laser stripping or chemical etching.

In some embodiments, the substrate 10 can be not removed. In other words, the substrate 10 remains in the resonant tunneling diode 1.

FIG. 4 is a cross-sectional schematic view of a resonant tunneling diode according to a second embodiment of the present disclosure.

Referring to FIG. 4, a resonant tunneling diode 2 and a manufacturing method thereof in the second embodiment are substantially the same as the resonant tunneling diode 1 and the manufacturing method thereof in the first embodiment, except that the second isolation layer 15 and a process of manufacturing the second isolation layer 15 are omitted.

Figure 5:
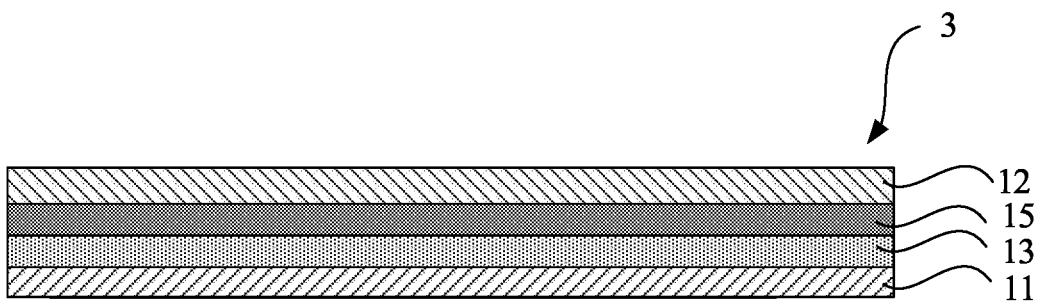
FIG. 5 is a cross-sectional schematic view of a resonant tunneling diode according to a third embodiment of the present disclosure.

FIG. 5 is a cross-sectional schematic view of a resonant tunneling diode according to a third embodiment of the present disclosure.

Referring to FIG. 5, a resonant tunneling diode 3 and a manufacturing method thereof in the third embodiment are substantially the same as the resonant tunneling diode 1 and the manufacturing method thereof in the first embodiment, except that the first isolation layer 14 and a process of manufacturing the first isolation layer 14 are omitted.

Figure 6:
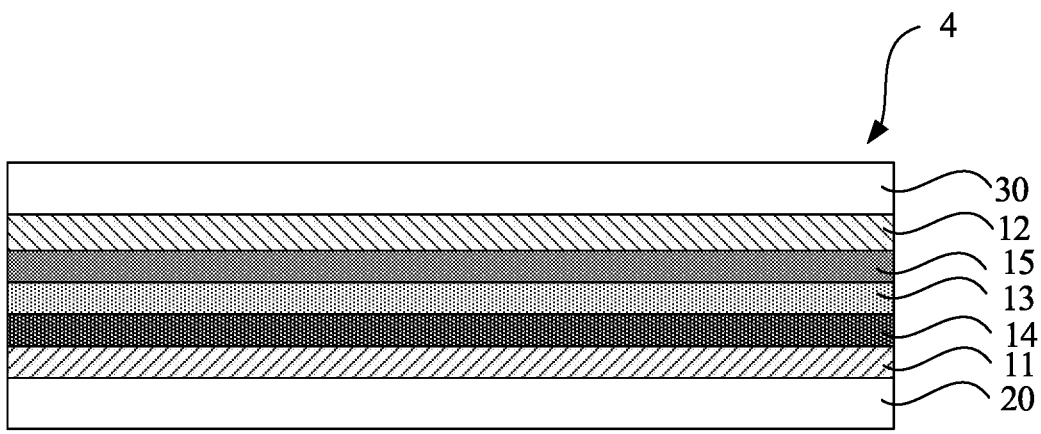
FIG. 6 is a cross-sectional schematic view of a resonant tunneling diode according to a fourth embodiment of the present disclosure.

FIG. 6 is a cross-sectional schematic view of a resonant tunneling diode according to a fourth embodiment of the present disclosure.

Referring to FIG. 6, a resonant tunneling diode 4 in the fourth embodiment is substantially the same as the resonant tunneling diode 1 in the first embodiment, the resonant tunneling diode 2 in the second embodiment, the resonant tunneling diode 3 in the third embodiment, except that the resonant tunneling diode 4 further includes a collector electrode 20 and an emitter electrode 30, the collector electrode 20 is close to the first barrier layer 11, and the emitter electrode 30 is close to the second barrier layer 12.

A material of the collector electrode 20 and a material of the emitter electrode 30 can include a group III nitride, for example, a GaN-based material, and more particularly, GaN.

Correspondingly, a manufacturing method in the present embodiment is substantially the same as the manufacturing methods in previous embodiments, except that step S3 is followed by step S4: the collector electrode 20 is epitaxially grown on a side of the first barrier layer 11 away from the potential well layer 13, the emitter electrode 30 is epitaxially grown on a side of the second barrier layer 12 away from the potential well layer 13, and the material of the collector electrode 20 and the material of the emitter electrode 30 include a group III nitride.

In other embodiments, a step of epitaxially growing the emitter electrode 30 on the side of the second barrier layer 12 away from the potential well layer 13 can be performed between step S2 and step S3.

A difference between the manufacturing method in the present embodiment and the manufacturing methods in the previous embodiments is that: at step S1: before the first barrier layer 11 is epitaxially grown, the collector electrode 20 is epitaxially grown on the substrate 10, the material of the collector electrode 20 includes a group III nitride; after the step S3 or between the step S2 and the step S3, epitaxially growing the emitter electrode 30 on the second barrier layer 12 is performed, where the material of the emitter electrode 30 includes a group III nitride.

Figure 7:
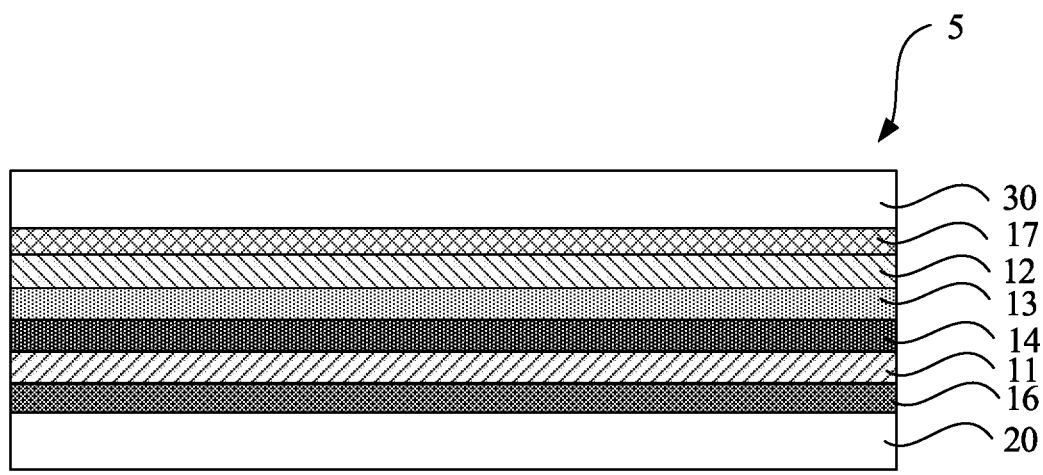
FIG. 7 is a cross-sectional schematic view of a resonant tunneling diode according to a fifth embodiment of the present disclosure.

FIG. 7 is a cross-sectional schematic view of a resonant tunneling diode according to a fifth embodiment of the present disclosure.

Referring to FIG. 7, a resonant tunneling diode 5 in the fifth embodiment is substantially the same as the resonant tunneling diode 4 in the fourth embodiment, except that a third isolation layer 16 is disposed between the collector electrode 20 and the first barrier layer 11, and a fourth isolation layer 17 is disposed between the emitter electrode 30 and the second barrier layer 12.

The third isolation layer 16 can prevent gallium atoms in the collector electrode 20 from diffusing to the first barrier layer 11. The fourth isolation layer 17 can prevent gallium atoms in the emitter electrode 30 from diffusing to the second barrier layer 12.

A material of the third isolation layer 16 and a material of the fourth isolation layer 17 can include AlN.

A thickness of the third isolation layer 16 can range from 0.1 nm to 2 nm. A thickness of the fourth isolation layer 17 can range from 0.1 nm to 2 nm.

In some embodiments, any one of the third isolation layer 16 and the fourth isolation layer 17 can be disposed.

Correspondingly, the manufacturing method in the present embodiment is substantially the same as the manufacturing methods in the previous embodiments, except that at step S4: before the collector electrode 20 is epitaxially grown on the side of the first barrier layer 11 away from the potential well layer 13, the third isolation layer 16 is epitaxially grown on the side of the first barrier layer 11 away from the potential well layer 13; or at step S1: after the collector electrode 20 is epitaxially grown on the substrate 10 and before the first barrier layer 11 is epitaxially grown, the third isolation layer 16 is epitaxially grown;

and/or, at step S4: before the emitter electrode 30 is epitaxially grown on the side of the second barrier layer 12 away from the potential well layer 13, a fourth isolation layer 17 is epitaxially grown on the side of the second barrier layer 12 away from the potential well layer 13.

Epitaxial growth processes of the third isolation layer 16 and the fourth isolation layer 17 can refer to the epitaxial growth processes of the first isolation layer 14 and the second isolation layer 15.

Although the present disclosure discloses the above contents, the present disclosure is not limited thereto. One of ordinary skill in the art can make various variants and modifications to the present disclosure without departing from the spirit and scope of the present disclosure. Therefore, the protection scope of the present disclosure should be set forth by the appended claims.

The invention claimed is:

1. A resonant tunneling diode, comprising:
   a first barrier layer;
   a second barrier layer;
   a potential well layer between the first barrier layer and the second barrier layer;
   a collector electrode;
   an emitter electrode, the collector electrode close to the first barrier layer, the emitter electrode close to the second barrier layer;
   a third isolation layer entirely between the collector electrode and the first barrier layer;
   wherein a material of the first barrier layer, a material of the second barrier layer, and a material of the potential well layer all comprise a group III nitride, a material of the third isolation layer comprises AlN, and the material of the potential well layer comprises a gallium element; and
   a first isolation layer between the first barrier layer and the potential well layer.

2. The resonant tunneling diode of claim 1, wherein the material of the first barrier layer and the material of the second barrier layer comprise at least one of AlGaN, AlInGaN, or InAlN, and a structure of one or more of the first barrier layer or the second barrier layer is a stacked structure with two layers.

3. The resonant tunneling diode of claim 1, wherein a material of the first isolation layer comprises AlN.

4. The resonant tunneling diode of claim 1, wherein a thickness of the first isolation layer ranges from 0.1 nm to 2 nm.

5. The resonant tunneling diode of claim 1, further comprising:
   a second isolation layer between the second barrier layer and the potential well layer;
   wherein a material of the second isolation layer comprises AlN, and a thickness of the second isolation layer ranges from 0.1 nm to 2 nm.

6. The resonant tunneling diode of claim 1, wherein a material of the collector electrode and a material of the emitter electrode comprise a GaN-based material.

7. The resonant tunneling diode of claim 1, further comprising:
   a fourth isolation layer between the emitter electrode and the second barrier layer, a material of the fourth isolation layer comprising AlN.

8. The resonant tunneling diode of claim 2, wherein the stacked structure with the two layers comprises one of: an AlGaN layer and an AlInGaN layer, an AlInGaN layer and an AlGaN layer, an InAlN layer and an AlInGaN layer, or an AlInGaN layer and an InAlN layer that are arranged from bottom to top.

9. The resonant tunneling diode of claim 2, wherein the structure of the one or more of the first barrier layer or the second barrier layer is the stacked structure with three layers, where materials of two layers that are adjacent to each other in the stacked structure are different.

10. A resonant tunneling diode, comprising:
a first barrier layer;
a second barrier layer;
a potential well layer between the first barrier layer and the second barrier layer;
a collector electrode;
an emitter electrode, the collector electrode close to the first barrier layer, the emitter electrode close to the second barrier layer;
a fourth isolation layer entirely between the emitter electrode and the second barrier layer;
wherein a material of the first barrier layer, a material of the second barrier layer, and a material of the potential well layer all comprise a group III nitride, a material of the fourth isolation layer comprises AlN, and the material of the potential well layer comprises a gallium element; and
a first isolation layer between the first barrier layer and the potential well layer.

* * * * *